(12) United States Patent
Kautzsch

(10) Patent No.: US 9,190,540 B2
(45) Date of Patent: Nov. 17, 2015

(54) PHOTO CELL DEVICES FOR PHASE-SENSITIVE DETECTION OF LIGHT SIGNALS

(75) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 13/332,926

(22) Filed: Dec. 21, 2011

(65) Prior Publication Data
US 2013/0162330 A1 Jun. 27, 2013

(51) Int. Cl.
| | |
|---|---|
| H01L 29/15 | (2006.01) |
| H01L 31/02 | (2006.01) |
| H01L 31/0352 | (2006.01) |
| H01L 31/103 | (2006.01) |
| G01S 7/486 | (2006.01) |

(52) U.S. Cl.
CPC ......... *H01L 31/02024* (2013.01); *G01S 7/4861* (2013.01); *H01L 31/03529* (2013.01); *H01L 31/103* (2013.01); *Y02E 10/50* (2013.01)

(58) Field of Classification Search
USPC ................................... 257/E31.054, 431, 459
See application file for complete search history.

(56) References Cited

U.S. PATENT DOCUMENTS

| | | | |
|---|---|---|---|
| 6,825,455 B1 | 11/2004 | Schwarte | |
| 6,927,889 B2 | 8/2005 | Schwarte | |
| 7,012,738 B1 | 3/2006 | Schwarte | |
| 7,053,357 B2 | 5/2006 | Schwarte | |
| 7,081,980 B2 | 7/2006 | Schwarte | |
| 7,264,982 B2 | 9/2007 | Cheng | |
| 7,626,685 B2 | 12/2009 | Jin | |
| 2007/0052056 A1 | 3/2007 | Doi et al. | |
| 2009/0266973 A1* | 10/2009 | Roy et al. ...................... | 250/206 |
| 2010/0295940 A1 | 11/2010 | Schwarte | |
| 2013/0062604 A1 | 3/2013 | Kautzsch | |
| 2013/0285187 A1 | 10/2013 | Kautzsch | |

FOREIGN PATENT DOCUMENTS

| | | |
|---|---|---|
| CN | 1819280 A | 8/2006 |
| CN | 101545771 A | 9/2009 |

OTHER PUBLICATIONS

Luan, Xuming, "Experimental Investigation of Photonic Mixer Device and Development of TOF 3D Ranging Systems Based on PMD Technology" Dissertation submitted Department of Electrical Engineering and Computer Science at University of Siegen, 136 pages, Nov. 2001.

* cited by examiner

*Primary Examiner* — Michael Shingleton
(74) *Attorney, Agent, or Firm* — Eschweiler & Associates, LLC

(57) ABSTRACT

Embodiments relate to photo cell devices. In one embodiment, a trench-based photo cells provides very fast capture of photo-generated charge carriers, particularly when compared with conventional approaches, as the trenches of the photo cells create depleted regions deep within the bulk of the substrate that avoid the time-consuming diffusion of carriers.

16 Claims, 3 Drawing Sheets

PHOTO CELL DEVICES FOR PHASE-SENSITIVE DETECTION OF LIGHT SIGNALS

TECHNICAL FIELD

The invention relates generally to photo cells and more particularly to photo cell devices for phase-sensitive detection of light signals.

BACKGROUND

Various sensors and gauges use delay measurements of acoustic and optic pulses or coded signals. In some applications, the measurement of a distance is coupled with pattern detection. This is the case, for example, in some time-of-flight techniques that use visible or infrared light. Due to the high velocity of light, the read-out circuitry has to work in a time-critical domain. The fast capture and evaluation of photo-generated charge carriers is a particular focus of cell design and read-out technique. Background current from carriers outside the space charge regions is to be avoided because carrier diffusion is time-consuming.

This is a challenging task, in particular, for infrared light because of its penetration depth, on the order of ten microns or more. Spreading an electric field from the place where photo-generated charge carriers have to be gathered to the penetration depth of infrared light, or deeper, is a challenging task. It is desired to address this disadvantageous situation, given that infrared light is the signal of choice in many applications because of its invisibility.

Conventional solutions use transient switching modes: at fast bias sweep conditions the semiconductor region underneath a metal-insulator-semiconductor (MIS) electrode is pulsed into a deep depletion state. In this operation mode the depletion width is larger than the maximum depletion width under equilibrium. This effect is used at devices with surface electrodes for carrier capturing, i.e., charger coupled devices (CCDs) or a photonic mixer device. As can be seen in FIG. 1A, infrared light generates electron hole pairs at least partly outside the space charge region at moderate substrate doping levels. These carriers contribute to noise and should be avoided. Additionally, and referring to FIG. 1B, three-dimensional formation of space charge regions can also occur, implying cross-talk in some device geometries and limiting the shrinking potential of the device. Therefore, there is a need for improved photo cell devices.

SUMMARY

Embodiments relate to photo cell devices. In an embodiment, a photo cell comprises a substrate; and at least two vertical trenches formed in the substrate and laterally spaced apart from one another such that when the photo cell operates in a depletion mode a space charge region extends laterally in the substrate with a first trench of the at least two vertical trenches disposed in the space charge region and a second trench of the at least two vertical trenches disposed in a neutral region of the substrate.

In an embodiment, a method comprises providing a first vertical trench having a depth of at least 5 microns in a substrate; and providing a second vertical trench having a depth of at least 5 microns in the substrate; and alternately depleting a first region of the substrate surrounding the first vertical trench and a second region of the substrate surrounding the second vertical trench by alternately applying a voltage to a first vertical trench gate contact and a second vertical trench gate contact.

In an embodiment, a photo cell comprises a p-substrate; and at least two vertical trenches formed in the substrate and laterally spaced apart from one another such that when a positive voltage is applied to a first trench of the at least two vertical trenches a space charge region extends laterally in the substrate with the first trench disposed in the space charge region and a second trench of the at least two vertical trenches disposed in a neutral region of the substrate, and when a positive voltage is applied to the second trench the space charge region extends laterally in the substrate with the second trench disposed in the space charge region and the first trench disposed in the neutral region.

In an embodiment, a photo cell comprises an n-substrate; and at least two vertical trenches formed in the substrate and laterally spaced apart from one another such that when a negative voltage is applied to a first trench of the at least two vertical trenches a space charge region extends laterally in the substrate with the first trench disposed in the space charge region and a second trench of the at least two vertical trenches disposed in a neutral region of the substrate, and when a negative voltage is applied to the second trench the space charge region extends laterally in the substrate with the second trench disposed in the space charge region and the first trench disposed in the neutral region.

BRIEF DESCRIPTION OF THE DRAWINGS

The invention may be more completely understood in consideration of the following detailed description of various embodiments of the invention in connection with the accompanying drawings, in which.

Figure 1A:
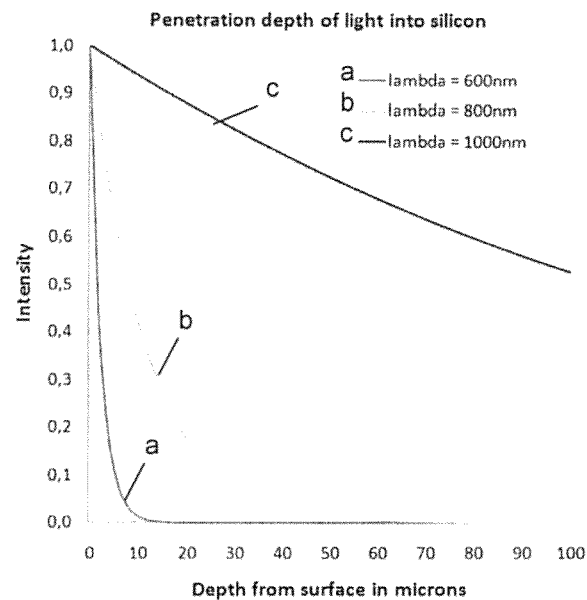
FIG. 1A is a graph of the penetration depth of various intensities of light into silicon.
Figure 1B:
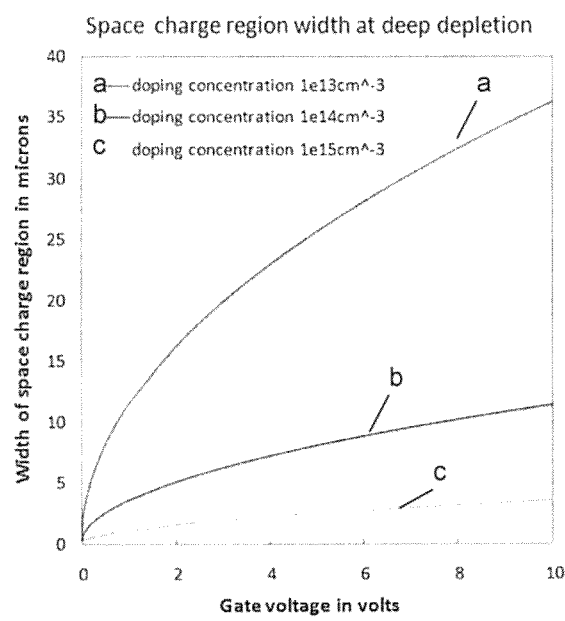
FIG. 1B is a graph of space charge region width at deep depletion.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to photo cell devices. In one embodiment, a trench-based photo cells provides very fast capture of photo-generated charge carriers, particularly when compared with conventional approaches, as the trenches of the photo cells create depleted regions deep within the bulk of the substrate that avoid the time-consuming diffusion of carriers.

Figure 2A:
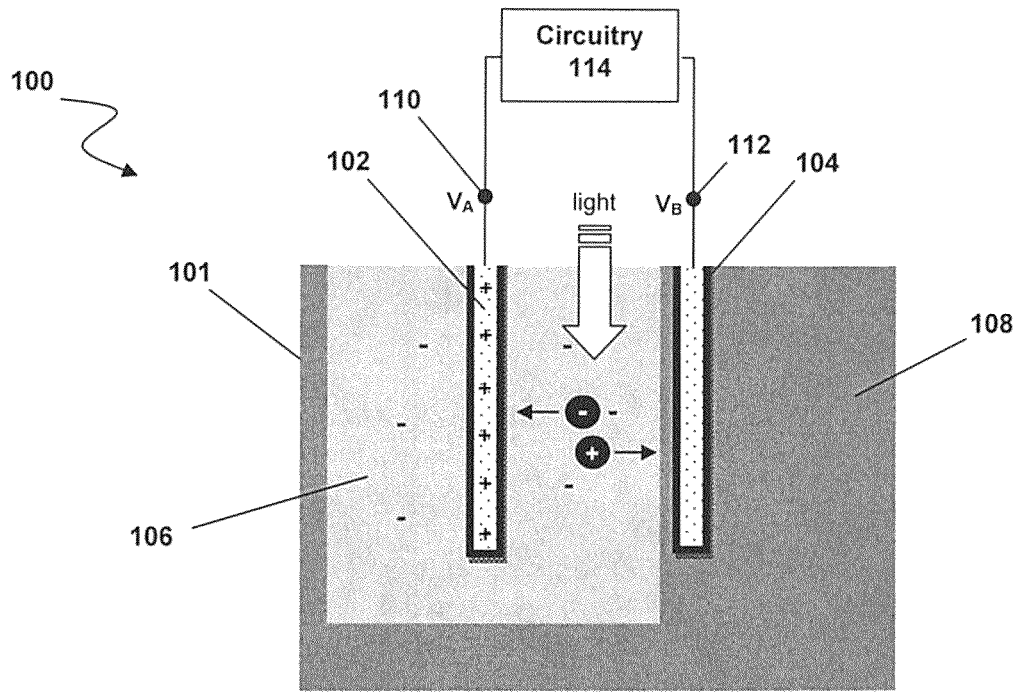
FIG. 2A is a side cross-sectional view of a photo cell device according to an embodiment.

Referring to FIG. 2A, an embodiment of a photo cell device 100 is depicted. Device 100 comprises at least two trenches formed in a substrate 101. In the embodiment of FIG. 2A, photo cell comprises two trenches, first trench 102 and second trench 104. If a positive bias voltage is applied to first trench 102, a space charge region 106 is formed within the substrate 101 as depicted, while second trench 104 is surrounded by a neutral region 108 when no bias is applied, in embodiments in which substrate 101 is a p-substrate. This configuration is reversed, i.e., space charge region 106 forms around second trench 104, when a positive voltage is applied to second trench 104 while first trench 102 is kept neutral. In n-substrate embodiments, the same space charge region configurations will occur when a negative, rather than positive, bias voltage is applied to first trench 102 or second trench 104.

Each trench 102 and 104 extends, for example, at least about 5 microns, such as about 30 microns or deeper, into device 100 in embodiments, though the particular depth of trenches 102 and 104 can be selected according to a wavelength of the light that will be the signal source. As depicted, trenches 102 and 104 extend to the same or similar depths, though this can vary in other embodiments. Trenches 102 and 104 thereby form vertical trench gates, reducing or eliminating the aforementioned vertical depletion limit because space charge region 106 is spread horizontally, i.e., in parallel with the surface of device 100. Other dimensions of trenches 102 and 104 can be, for example, about 0.1 microns to about 5 microns wide and about 0.1 microns to about 100 microns long (referring to the dimensions shown in the top views of FIGS. 3A and 3B).

Figure 3A:
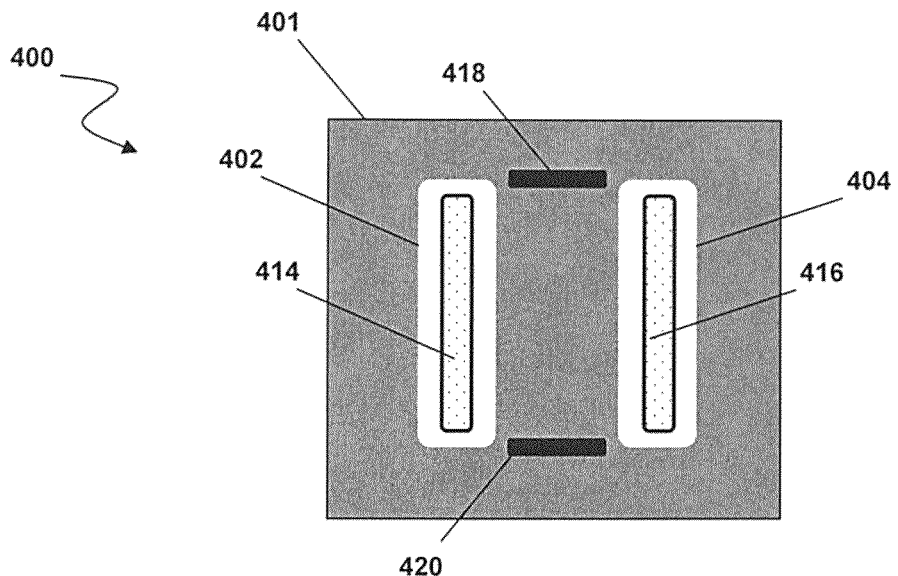
FIG. 3A is a top view of a photo cell device according to an embodiment.
Figure 3B:
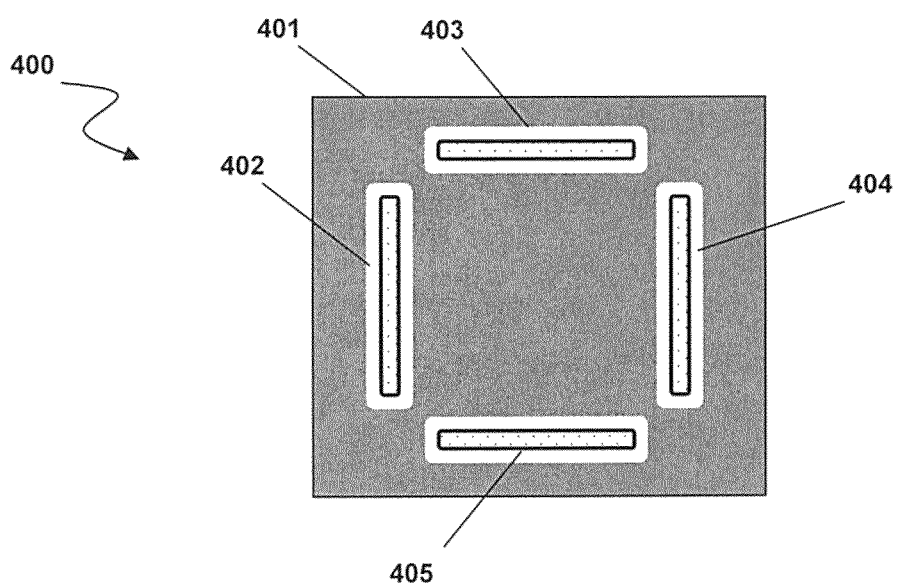
FIG. 3B is a top view of a photo cell device according to an embodiment.

The separation between trenches 102 and 104, horizontally as depicted on the page of FIG. 2A, is related in embodiments to a doping level of substrate 101 such that operation forces a fully depleted gap between trenches 102 and 104. Thus, while embodiments can comprise more than two trenches, the lateral depletion requirement means it can be impractical to situate more than two trenches side-by-side. Nevertheless, embodiments can provide much smaller lateral dimensions than conventional photonic mixer devices, such as about 1 micron or less, and various configurations are possible. Referring to FIG. 3A, a device 400 comprises two gate trenches 402 and 404, formed in a substrate 401, with contacts 414 and 416, respectively. Bulk contacts 418 and 420 are also depicted. In FIG. 3B, four trenches 402, 403, 404 and 405 are included, a configuration which can provide circular bias voltages.

Figure 2B:
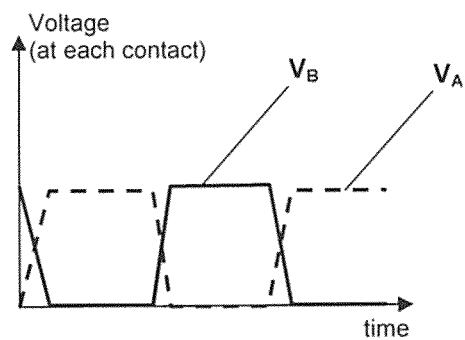
FIG. 2B is a voltage diagram according to an embodiment.

In use, such as when device 100 operates as a phase sensitive detector, electrodes 110 and 112 of adjacent trenches 102 and 104, respectively, are biased alternately with a positive voltage, i.e., a fast sweep, as depicted in FIG. 2B. Electrons are collected at the trench gate surfaces and extracted from device 100 by local n-doped regions and contacts, while holes are rejected to the bulk of substrate 101 and collected by a substrate contact. Readout circuitry 114 then can be used to compare the charge amount gathered at each contact. Because the trenches 102 and 104 operate in a depletion mode with a fixed frequency set to the frequency of a signal sent, a phase correlation between the light pulse and its reflection can be evaluated.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A photo cell comprising:
   a substrate; and
   at least two vertical trenches formed in the substrate and laterally spaced apart from one another such that a doping type of a bulk of the substrate around and between the at least two vertical trenches is the same, wherein when the photo cell operates in a depletion mode a space charge region extends laterally in the substrate with a first trench of the at least two vertical trenches disposed in the space charge region and a second trench of the at least two vertical trenches disposed in a neutral region of the substrate,
   wherein a depth of the at least two trenches is related to a wavelength of a signal source.

2. The photo cell of claim 1, wherein the at least two vertical trenches extend at least about 5 microns into the substrate.

3. The photo cell of claim 2, wherein the at least two vertical trenches extend at least about 30 microns into the substrate.

4. The photo cell of claim 3, wherein a width of each of the at least two vertical trenches is about 0.1 microns to about 5 microns, and where a length of each of the at least two vertical trenches is about 0.1 microns to about 100 microns.

5. The photo cell of claim 1, wherein the space charge region is formed within the neutral region.

6. A photo cell comprising:
   a substrate; and
   at least two vertical trenches formed in the substrate and laterally spaced apart from one another such that a doping type of a bulk of the substrate around and between the at least two vertical trenches is the same, wherein when the photo cell operates in a depletion mode a space charge region extends laterally in the substrate with a first trench of the at least two vertical trenches disposed in the space charge region and a second trench of the at least two vertical trenches disposed in a neutral region of the substrate,
   where a lateral distance separating the at least two vertical trenches is related to a doping level of the substrate such that upon operation a biasing of one of the at least two vertical trenches results in formation of a fully depleted gap between the at least two verticle trenches.

7. The photo cell of claim 6, wherein the lateral distance separating the at least two vertical trenches is in a range of about 0.5 microns to about 100 microns.

8. The photo cell of claim 1, further comprising at least two electrodes, a first electrode coupled to the first trench and a second electrode coupled to the second trench.

9. The photo cell of claim 8, wherein the electrodes are configured to be biased alternately with a positive voltage.

10. The photo cell of claim 8, further comprising circuitry coupled to the electrodes and configured to compare a charge at the first electrode with a charge at the second electrode.

11. The photo cell of claim 1, wherein the first trench is substantially parallel to the second trenches.

12. A photo cell comprising;
    a substrate;
    at least two vertical trenches formed in the substrate and laterally spaced apart from one another such that a doping type of a bulk of the substrate around and between the at least two vertical trenches is the same, wherein when the photo cell operates in a depletion mode a space charge region extends laterally in the substrate with a first trench of the at least two vertical trenches disposed in the space charge region and a second trench of the at least two vertical trenches disposed in a neutral region of the substrate;
    and
    a third trench and a fourth trench formed in the substrate.

13. The photo cell of claim 12, wherein the first and second trenches are substantially parallel with one another in a first pair, the third and fourth trenches are substantially parallel with another in a second pair, and the first and second pairs are substantially perpendicular with one another.

14. The photo cell of claim 13, wherein the first and second pairs are configured to receive, alternately by the first pair and the second pair, a bias voltage.

15. The photo cell of claim 1, wherein the first trench is disposed in the space charge region when a positive voltage is applied to the first trench and the substrate comprises a p-substrate.

16. The photo cell of claim 1, wherein the first trench, is disposed in the space charge region when a negative voltage is applied to the first trench and the substrate comprises an n-substrate.

* * * * *

UNITED STATES PATENT AND TRADEMARK OFFICE
CERTIFICATE OF CORRECTION

| | | |
|---|---|---|
| PATENT NO. | : 9,190,540 B2 | Page 1 of 1 |
| APPLICATION NO. | : 13/332926 | |
| DATED | : November 17, 2015 | |
| INVENTOR(S) | : Thoralf Kautzsch | |

It is certified that error appears in the above-identified patent and that said Letters Patent is hereby corrected as shown below:

Claims

Column 4, Claim 6, Line 67 Please replace "…two verticle trenches."
with --…two vertical trenches.--

Signed and Sealed this
Twenty-second Day of March, 2016

Michelle K. Lee
*Director of the United States Patent and Trademark Office*